US005210446A

United States Patent [19]

Niuya et al.

[11] Patent Number: 5,210,446

[45] Date of Patent: May 11, 1993

[54] SUBSTRATE POTENTIAL GENERATING CIRCUIT EMPLOYING SCHOTTKY DIODES

[75] Inventors: Takayuki Niuya, Tsukuba; Yoshihiro Ogata, Tsuchiura, both of Japan

[73] Assignee: Texas Instruments Incorporated, Dallas, Tex.

[21] Appl. No.: 798,389

[22] Filed: Nov. 26, 1991

[30] Foreign Application Priority Data

Nov. 30, 1990 [JP] Japan ................................ 2-339473

[51] Int. Cl.$^5$ .......................... H03K 3/01; H03K 3/26

[52] U.S. Cl. .............................. 307/296.2; 307/317.2; 307/285; 307/303; 307/304; 307/578

[58] Field of Search ............... 307/317.1, 317.2, 296.1, 307/285, 303, 303.1-301.2, 304, 578

[56] References Cited

U.S. PATENT DOCUMENTS 4,223,238 9/1980 Parkinson et al. .................. 307/285

4,255,677 3/1981 Boonstra et al. .................... 307/304

FOREIGN PATENT DOCUMENTS 0062894 10/1982 European Pat. Off. .

OTHER PUBLICATIONS

IBM Tech. Disc. Bul. Vol. 27, No. 2, Jul 1984, "Substrate Voltage Regulation", Cassidy et al.

"Substrate and load Gate Voltage Compensation", 1976 IEEE ISSCC 76, Feb. 1976, Digest of Technical Papers, vol. XIX, 76CH1046-2 ISSCC.

*Primary Examiner*—William L. Sikes

*Assistant Examiner*—Margaret R. Wambach

*Attorney, Agent, or Firm*—William E. Hiller; Richard L. Donaldson

[57] ABSTRACT

Substrate bias generating circuit for MIS semiconductor device comprising an oscillating circuit, a capacitor, an MOS transistor and a Schottky barrier diode. One end of the oscillating circuit is connected to a $V_{ss}$ terminal which provides a reference potential. The capacitor is connected at one end thereof to the other end of the oscillating circuit. The MOS transistor is connected between the $V_{ss}$ terminal and the other end of the capacitor, with the Schottky barrier diode being connected between a node located between the other end of the capacitor and the MOS transistor, and the substrate. The Schottky barrier diode is operated by the majority carrier, thereby enabling the majority charge to be directly pumped out of the substrate and into the terminal $V_{ss}$ through the Schottky barrier diode with stability without requiring an injection of the minority charge into the semiconductor substrate. The pumping of the charge out of the substrate is permitted by lowering the potential of the node through the oscillating circuit.

7 Claims, 1 Drawing Sheet

SUBSTRATE POTENTIAL GENERATING CIRCUIT EMPLOYING SCHOTTKY DIODES

BACKGROUND OF THE INVENTION

1. Field of the Invention

The present invention relates to a semiconductor device, and relates in particular to a substrate potential generating circuit for an MIS (Metal Insulator Semiconductor) type semiconductor device.

In order to make the bias of the substrate in a semiconductor device negative, a substrate potential generating circuit (substrate bias generating circuit) is installed to pump the charge of the substrate into the Vss terminal according to charge pumping principles. In order to accomplish this, it is necessary to have a diode component, although the pn junction of the semiconductor device cannot itself be used as the diode. The reason for this is that when the charge is pumped out of the p-type substrate, a forward current is generated to inject electrons into the substrate. These electrons cause malfunctions such as destruction of the charge which is stored in the DRAM memory.

Thus, in the past, the diode component has been constructed using MOS transistors, as shown in FIGS. 4 and 5.

The substrate potential generating circuit shown in FIG. 4 is a circuit in which a p-channel MOS transistor is used as the diode component, and in which an oscillating circuit (1), capacitor element (2), p-channel MOS transistor (3), and p-channel MOS transistor (4) are connected as shown in the figure.

With this substrate potential generating circuit, the p-channel MOS transistor (4) and p-channel MOS transistor (3) function as diodes to pump the majority charge of the p-type substrate into the Vss terminal according to charge pumping principles, thereby providing the p-type semiconductor substrate with a negative bias.

The substrate potential generating circuit of FIG. 5 is a circuit in which the p-channel MOS transistor (4) of FIG. 4 is replaced by an n-channel MOS transistor (6). This circuit also pumps the majority charge of the p-type semiconductor substrate into the Vss terminal according to charge pumping principles to provide the substrate with a negative bias.

Typically a power source bias in the range of +5 V is applied in the substrate potential generating circuit shown in FIG. 4. In addition, the threshold value voltage $V_T$ of the p-channel MOS transistor (4) is in the range of 1.7 V. The potential at a node N1 is lowered to approximately −5 V by the oscillating circuit (1), although since the threshold value voltage $V_T$ of the p-channel MOS transistor (4) is in the range of 1.7 V, the potential of the node N1 is actually only lowered to approximately −3.3 V. In other words, the substrate potential generating circuit of FIG. 4 is unreliable in operation in that it has a shallow charge pumping depth which causes poor charge pumping efficiency, because the threshold value voltage $V_T$ of the p-channel MOS transistor (4) is high.

With the substrate potential generating circuit of FIG. 5, the threshold value voltage $V_T$ of the n-channel MOS transistor (6) is typically in the range of 0.4–0.5 V, and the pn junction forward voltage $V_F$ of the n-channel MOS transistor is in the range of 0.6 V. Thus, the threshold value voltage $V_T$ and the voltage $V_F$ are close to each other. As a result, when voltage fluctuations occur in the semiconductor device, minority carriers may be injected due to the competition occurring at the junction. These minority carriers when present may cause malfunctions such as a destruction of the data stored in a DRAM memory.

It is an object of the present invention to provide a substrate potential generating circuit in which a Schottky barrier diode is employed as the diode component of the substrate potential generating circuit to prevent injection of minority carriers into the substrate as charge is being pumped from the substrate.

Specifically, the substrate potential generating circuit of the present invention is constructed with the following: an oscillating circuit, a capacitor element which is connected to said oscillating circuit at a first contact point, a MOS transistor which is connected between a second contact point of said capacitor element and the reference potential of a semiconductor device, such as said terminal Vss, and a Schottky barrier diode, which is connected between the substrate of the semiconductor device and said second connecting point to face said second connecting point.

Since the Schottky barrier diode is operated by the majority carrier, the majority charge is directly pumped out of the p-type semiconductor device. Thus, it is possible to pump the hole charge with stability without injecting the minority charge, thus making it possible to provide the semiconductor substrate with a negative bias with stability.

DESCRIPTION OF THE PREFERRED EMBODIMENTS

Figure 1:
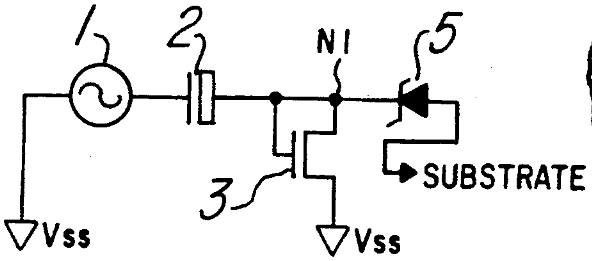
FIG. 1 is a circuit diagram of the substrate potential generating circuit of an embodiment of the present invention.

FIG. 1 shows a circuit diagram of an embodiment of the substrate potential generating circuit of the present invention.

This substrate potential generating circuit comprises the following, an oscillating circuit (1), one end of which is connected to a Vss terminal that acts as the reference potential; a capacitor element (2), which is connected to this oscillating circuit (1); a MOS transistor (3), which is connected between the Vss terminal and the other end of this capacitor element (2); and a Schottky barrier diode (5), which is connected between a node N1 and the substrate.

Figure 4:
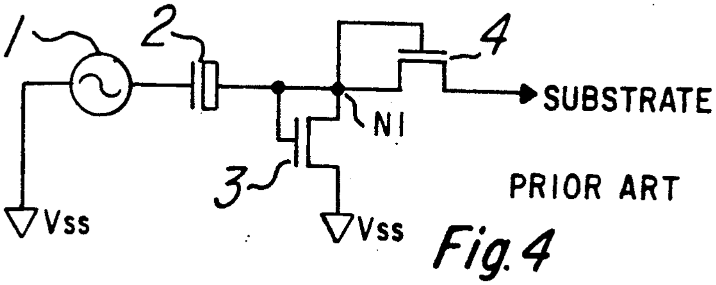
PRIOR ART Fig. 4
FIGS. 4 and 5 are respective circuit diagrams of conventional substrate bias generating circuits.
Figure 5:
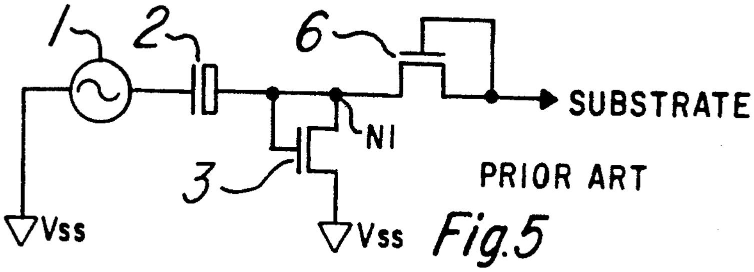
PRIOR ART Fig. 5

The operating principles of this substrate potential generating circuit follow the charge pumping principles in the same manner as the operations previously described for FIGS. 4 and 5. Specifically, the potential of the node N1 is lowered by the oscillating circuit (1), thereby allowing the charge to be pumped out of the substrate and into the terminal Vss through the Schottky barrier diode (5). The MOS transistor (3) also functions as a diode. This MOS transistor (3) may be either a p-channel MOS transistor or an n-channel MOS transistor.

In the Schottky barrier diode (5), the holes which are the majority carrier in the semiconductor substrate flow directly through the barrier and into the metal end, allowing a forward current to flow. Specifically, since the forward current is the majority carrier in the Schottky barrier diode (5), it is possible to pump the charge directly out of the substrate and into the Vss terminal. In addition, since the voltage $V_F$ is in the range of 0.4 V, the operations can take place with stability without an injection of the minority charge into the substrate.

In addition, the rising voltage of the Schottky barrier diode (5) is low. For example, whereas the rising voltage of the n-channel MOS transistor (6) in FIG. 5 is in the range of 0.4–0.6 V, the rising voltage of the Schottky barrier diode (5) is in the range of 0.2 V. Thus, it is possible to make the potential of the substrate sufficiently negative.

Figure 2:
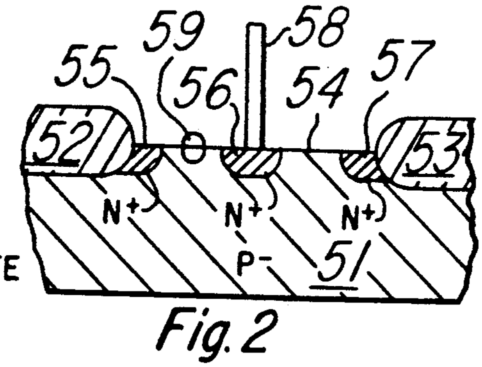
FIG. 2 is a cross-sectional view of the Schottky barrier diode shown in the circuit of FIG. 1.

FIG. 2 shows a cross section of the formation of the Schottky barrier diode (5). In this example, the Schottky barrier diode (5) is composed as shown in the figure with a p-substrate (51), $SiO_2$ films (52) and (53), $n^+$ buried layers (55)-(57), a titanium silicide ($TiSi_2$) layer (54), and a contact (58). A Schottky barrier layer (59) is formed on the junction surface between the metal $TiSi_2$ layer (54) and the p-substrate (51) below it. The contact (58) is used to make the connection to the first node N1. The $n^+$ buried layers (55) and (57) function as guard banks.

The oscillating circuit (1), capacitor element (2), MOS transistor (3) and Schottky barrier diode (5) are ordinarily located inside the semiconductor device containing the substrate to be biased. Thus, the wiring between the circuits shown in FIG. 1 is carried out inside the semiconductor device. In addition, it is also possible to use a parasitic capacity for the capacitor element, depending on its capacity.

It is possible to form the Schottky barrier diode (5) in an n-type semiconductor device in the same manner as above by using an n-type substrate in place of the p-substrate (51) of FIG. 2.

Figure 3:
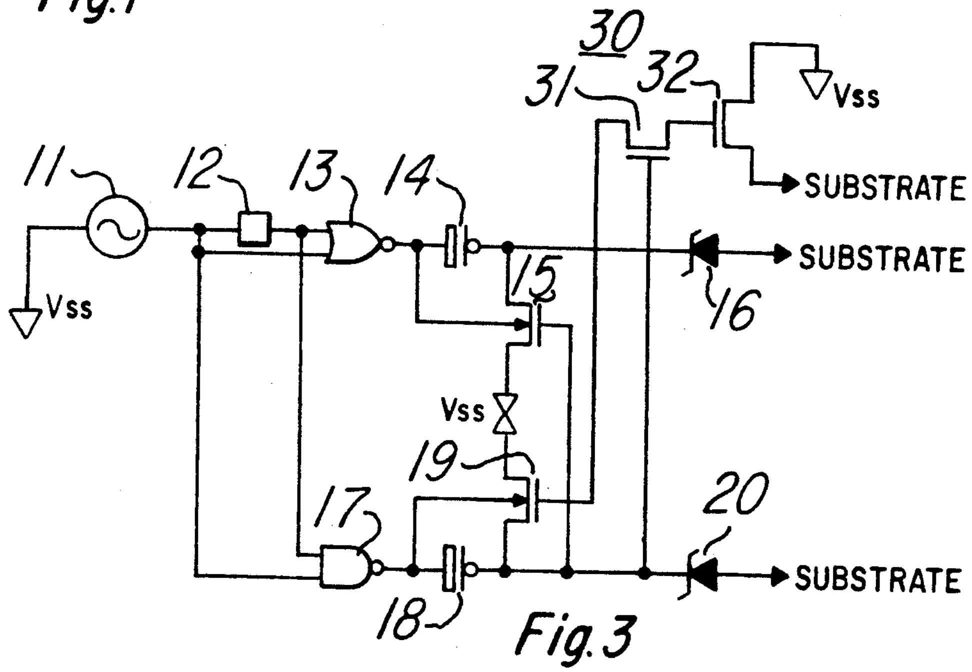
FIG. 3 is a circuit diagram of a substrate potential generating system employing substrate potential generating circuit of the present invention as applied in a DRAM memory device.

FIG. 3 shows the substrate potential generating circuit of FIG. 1 applied to a DRAM.

The following connections are made in the circuit in FIG. 3, as shown in the figure: an oscillating circuit (11), delay circuit (12), NOR gate (13), capacitor (14), MOS transistor (15), Schottky barrier (SB) diode (16), NAND gate (17), capacitor (18), MOS transistor (19), SB diode (20), and a power up holding circuit (30), which comprises MOS transistors (31) and (32).

The oscillating circuit (11), capacitor (14), MOS transistor (15), and SB diode (16) correspond to the oscillating circuit (I), capacitor element (2), MOS transistor (3), and Schottky barrier diode (5) of FIG. 1. In the same manner, the capacitor (18), MOS transistor (19), and SB diode (20) correspond to the capacitor element (2), MOS transistor (3), and Schottky barrier diode (5) of FIG. 1. In the present circuit example, in order to improve the charge pumping efficiency, the substrate potential generating circuits of two opposing systems are used. Thus, the delay circuit (12), NOR gate (13), and NAND gate (17) are used so that the upper and lower substrate potential generating circuits will operate opposite each other.

In addition, the circuit in FIG. 3 provides good charge pumping out of the substrate even when the power up holding circuit (30) causes fluctuations in the power source voltage.

The aforementioned examples relate to a MOS semiconductor device, although the substrate potential generating circuit of the present invention is not limited to MOS semiconductor devices. Rather, it can be applied in general to MIS semiconductor devices.

With the substrate potential generating circuit of the present invention, it is possible to provide the substrate of a semiconductor device with a bias efficiently and with stability.

What is claimed is:

1. A semiconductor substrate potential generating circuit comprising:
   - an oscillating circuit;
   - a capacitor element including first and second capacitor plate and a dielectric therebetween;
   - a field-effect transistor having a control gate and a source-drain path connected at a node to one of the capacitor plates of said capacitor element and to a reference potential terminal;
   - said oscillating circuit being connected to the other capacitor plate of said capacitor element and to the reference potential terminal;
   - a Schottky barrier diode connected to the semiconductor substrate whose bias potential is to be controlled on its cathode side and to said one plate of said capacitor element on its anode side with the node associated with the source-drain path of said field-effect transistor being connected between said capacitor element and said Schottky barrier diode; and
   - majority charge being pumped directly out of said substrate and into the reference potential terminal via said Schottky barrier diode without an injection of the minority charge into the substrate.

2. A semiconductor substrate potential generating system comprising:
   - a first semiconductor substrate potential generating circuit for pumping charge from a semiconductor substrate into a reference potential terminal;
   - a second semiconductor substrate potential generating circuit for pumping charge from the semiconductor substrate into the reference potential terminal;
   - a power-up holding circuit connected between the semiconductor substrate and the reference potential terminal and to one of said first and second semiconductor substrate potential generating circuits for controlling the pumping of charge from the substrate into the reference potential terminal by the said one of said first and second semiconductor substrate potential generating circuits; and
   - logic means interconnected with said first and second semiconductor substrate potential generating circuits;
   - said first and second semiconductor substrate potential generating circuit being responsive to said logic means so as to operate in opposition to each other for providing charge pumping from the substrate into the reference potential terminal at enhanced efficiency.

3. A semiconductor substrate potential generating system as set forth in claim 2, wherein each of said first and second semiconductor substrate potential generating circuits includes:
   - a capacitor element having first and second plates with a dielectric therebetween, a field-effect transistor having a control gate and a source-drain path connected at a node to one of the capacitor plates of said capacitor element and to the reference potential terminal, and a diode connected to said semiconductor substrate on its cathode side and to said one plate of said capacitor element on its anode side with the node associated with the source-drain path of said field-effect transistor being connected between said capacitor element and said diode; and an oscillating circuit connected to the other capacitor plate of said capacitor element of each of said first and second semiconductor substrate potential generating circuits;

said logic means being connected between said oscillating circuit and the other capacitor plate of each of said capacitor elements of said first and second semiconductor substrate potential generating circuits.

4. A semiconductor substrate potential generating system as set forth in claim 3, wherein said power-up holding circuit includes first and second field-effect transistors having respective control gates;

said first field-effect transistor of said power-up holding circuit being connected between the substrate and the reference potential terminal, said second field-effect transistor of said power-up holding circuit being connected between the control gate of said field-effect transistor of said second semiconductor substrate potential generating circuit and the control gate of said first field-effect transistor of said power-up holding circuit, and the control gate of said second field-effect transistor of said power-up holding circuit being connected between said diode and said capacitor element of said second semiconductor substrate potential generating circuit so as to be interposed between said one plate of said capacitor element and said anode of said diode.

5. A semiconductor substrate potential generating system as set forth in claim 4, wherein the control gate of said field-effect transistor of said first semiconductor substrate potential generating circuit is connected between said one capacitor plate of said capacitor element and the anode of said diode of said second semiconductor substrate potential generating circuit.

6. A semiconductor substrate potential generating system as set forth in claim 5, wherein said diode of each of said first and second semiconductor substrate potential generating circuits is a Schottky barrier diode.

7. A semiconductor substrate potential generating system as set forth in claim 6, wherein said logic means includes a NOR gate connected to the other capacitor plate of said capacitor element of said first semiconductor substrate potential generating circuit, a NAND gate connected to the other capacitor plate of said capacitor element of said second semiconductor substrate potential generating circuit, the output of said oscillating circuit being connected to one input of each of said NOR gate and said NAND gate, and a delay circuit connected between the output of said oscillating circuit and the other input of each of said NOR gate and said NAND gate.

* * * * *